US012604688B2

(12) United States Patent (10) Patent No.: US 12,604,688 B2

Aga et al. (45) Date of Patent: Apr. 14, 2026

(54) METHOD FOR MANUFACTURING SOI WAFER

(71) Applicant: SHIN-ETSU HANDOTAI CO., LTD., Tokyo (JP)

(72) Inventors: Hiroji Aga, Takasaki (JP); Isao Yokokawa, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 626 days.

(21) Appl. No.: 17/922,846

(22) PCT Filed: Apr. 14, 2021

(86) PCT No.: PCT/JP2021/015378

§ 371 (c)(1),
(2) Date: Nov. 2, 2022

(87) PCT Pub. No.: WO2021/241044

PCT Pub. Date: Dec. 2, 2021

(65) Prior Publication Data

US 2023/0154761 A1 May 18, 2023

(30) Foreign Application Priority Data

May 26, 2020 (JP) ................................. 2020-091413

(51) Int. Cl.
*H01L 21/311* (2006.01)
*H01L 21/762* (2006.01)

(52) U.S. Cl.
CPC .. *H01L 21/31111* (2013.01); *H01L 21/76243* (2013.01)

(58) Field of Classification Search
CPC ......... H01L 21/31111; H01L 21/76243; H01L 21/02052; H01L 21/7624; H01L 21/76251; H01L 21/30604; H01L 21/02238
See application file for complete search history.

(56) References Cited

U.S. PATENT DOCUMENTS 9,735,062 B1 * 8/2017 Doris .................. H01L 21/0262
2006/0097355 A1 5/2006 Bauer et al.
(Continued)

FOREIGN PATENT DOCUMENTS

EP 0676796 B1 10/2002
JP 2004-349493 A 12/2004
(Continued)

OTHER PUBLICATIONS

Jun. 15, 2021 International Search Report issued in International Patent Application No. PCT/JP2021/015378.
(Continued)

*Primary Examiner* — Dale E Page
*Assistant Examiner* — Quovaunda Jefferson
(74) *Attorney, Agent, or Firm* — Oliff PLC

(57) ABSTRACT

A method for manufacturing an SOI wafer including a step of performing an adjustment to a film thickness of an SOI layer of the SOI wafer by wet etching. In the step of performing the adjustment to the film thickness of the SOI layer, a first etching step of etching a surface of the SOI layer using an SC1 solution; and a second etching step of etching the surface of the SOI layer by bringing the SOI layer into contact with ozone water to form an oxide film on the surface of the SOI layer and then bringing the formed oxide film into contact with an HF-containing aqueous solution to remove the oxide film, are performed in combination. The etchings are performed such that a removal amount of the
(Continued)

SOI layer in the first etching step is smaller than that in the second etching step.

17 Claims, 6 Drawing Sheets

(56)                    References Cited

U.S. PATENT DOCUMENTS

| 2006/0234461 A1 | 10/2006 | Nishihata et al. |
| 2007/0190746 A1 | 8/2007 | Ito et al. |
| 2007/0224778 A1 | 9/2007 | Murakami et al. |
| 2013/0233344 A1 | 9/2013 | Kabasawa et al. |
| 2017/0200634 A1 | 7/2017 | Aga |
| 2019/0198385 A1 | 6/2019 | Moriceau et al. |

FOREIGN PATENT DOCUMENTS

| JP | 2006-303089 A | 11/2006 |
| JP | 2007-266059 A | 10/2007 |
| JP | 2010-045148 A | 2/2010 |
| JP | 2010-092909 A | 4/2010 |
| JP | 2012-129409 A | 7/2012 |
| JP | 2016-004890 A | 1/2016 |
| JP | 2019-087617 A | 6/2019 |
| KR | 20040100954 A | 12/2004 |

OTHER PUBLICATIONS

Nov. 17, 2022 International Preliminary Report on Patentability issued in International Patent Application No. PCT/JP2021/015378.
Jul. 16, 2024 Office Action issued in Taiwanese Patent Application No. 110114438.
Jun. 12, 2024 Extended Search Report issued in European Patent Application No. 21812925.2.
Nov. 28, 2024 Office Action issued in Taiwanese Patent Application No. 110114438.
Feb. 22, 2025 Office Action issued in Chinese Patent Application No. 202180032683.7.
Sep. 3, 2025 Office Action issued in Korean Patent Application No. 10-2022-7039718 (with partial translation).

* cited by examiner

[FIG. 1]
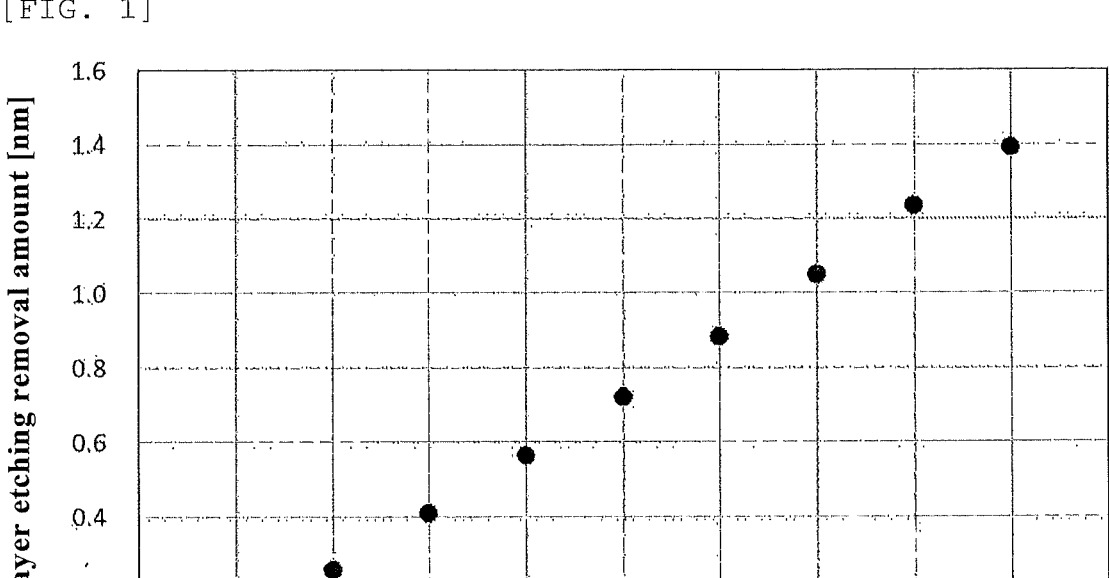
[FIG. 2]
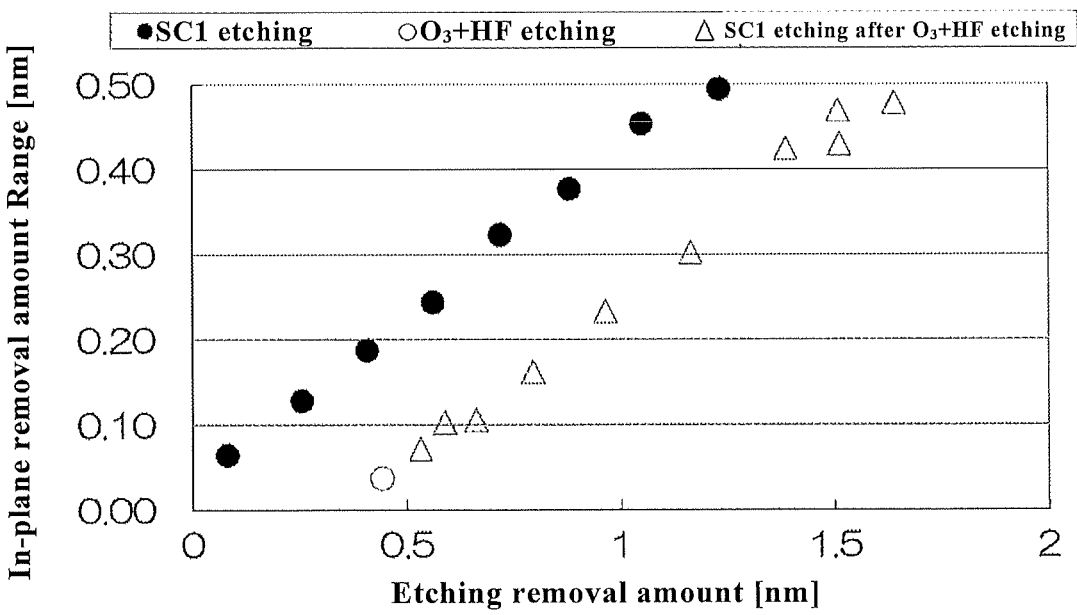

[FIG. 3]
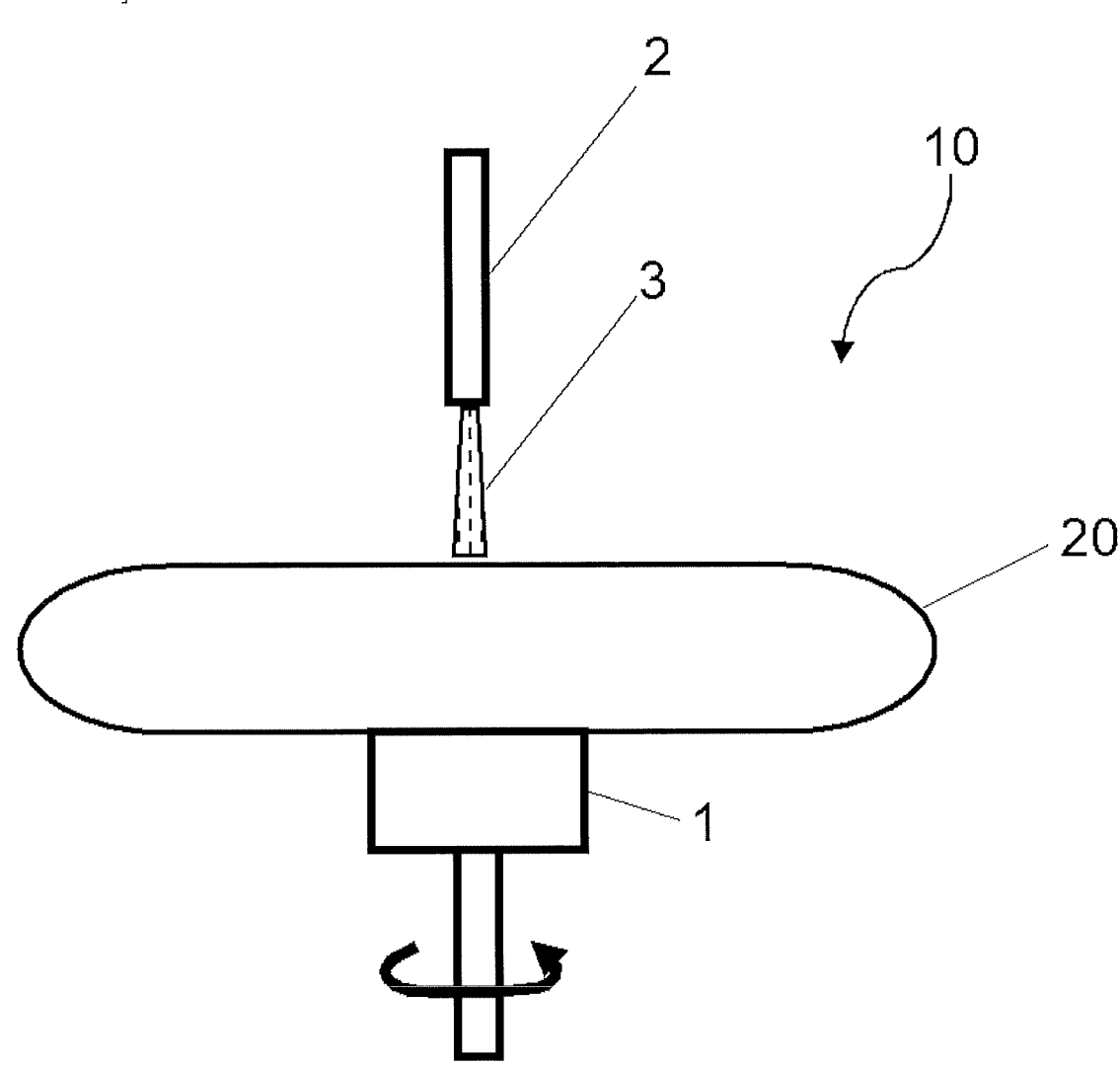

[FIG. 4]
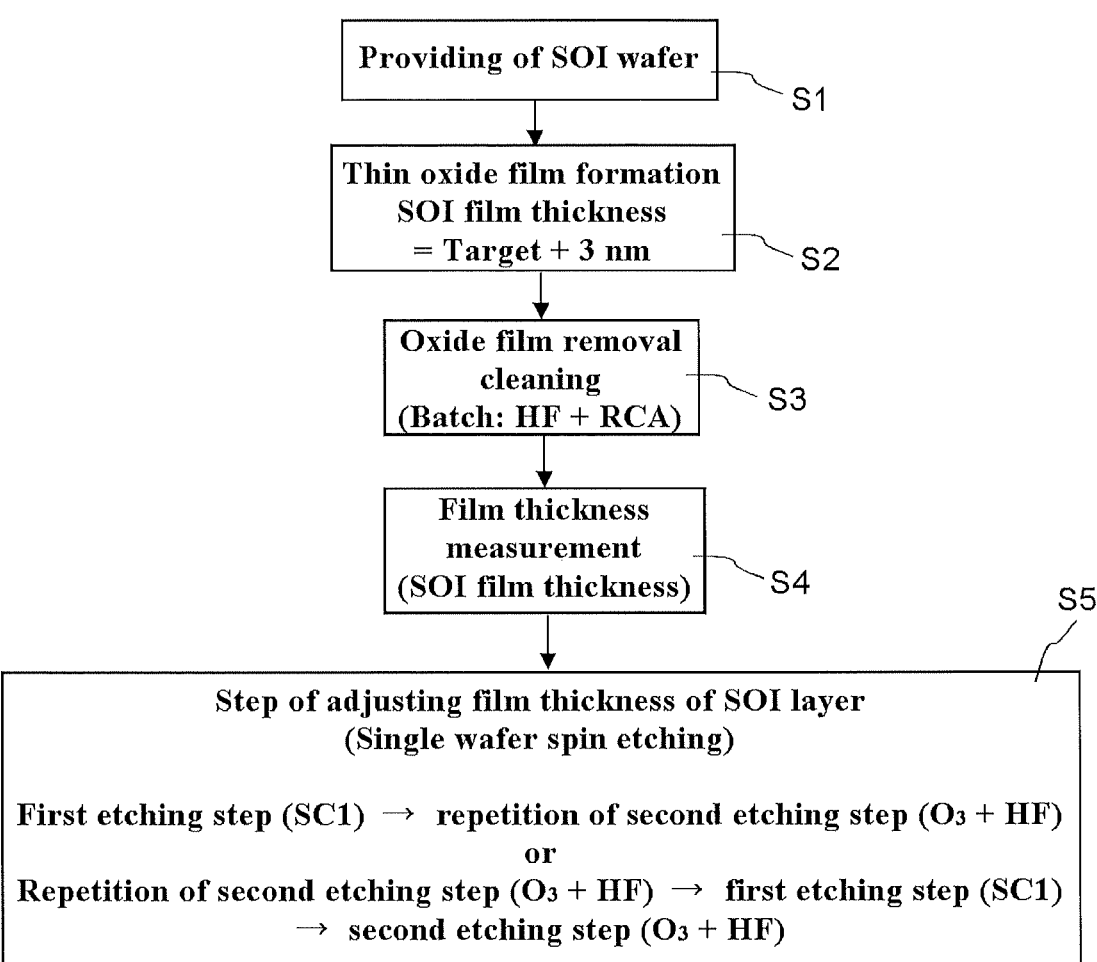

[FIG. 5]
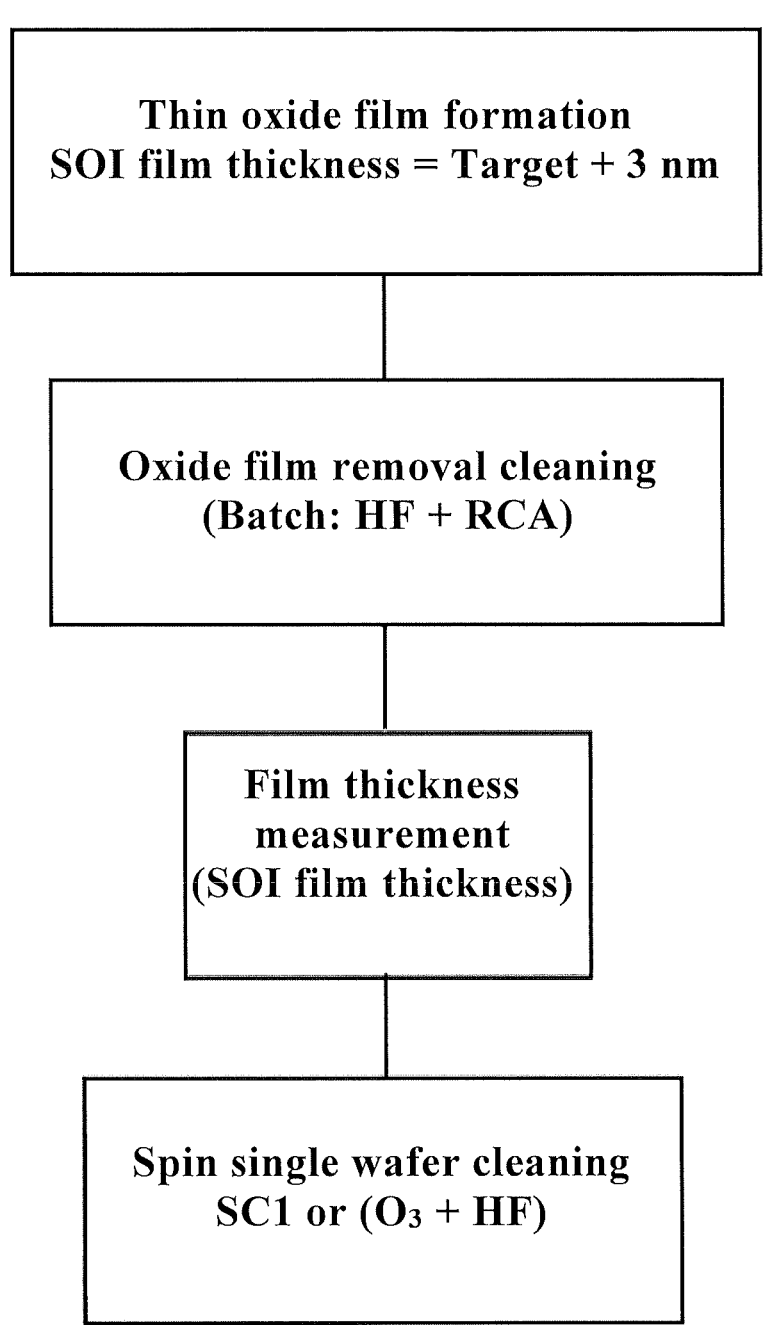

[FIG. 6]
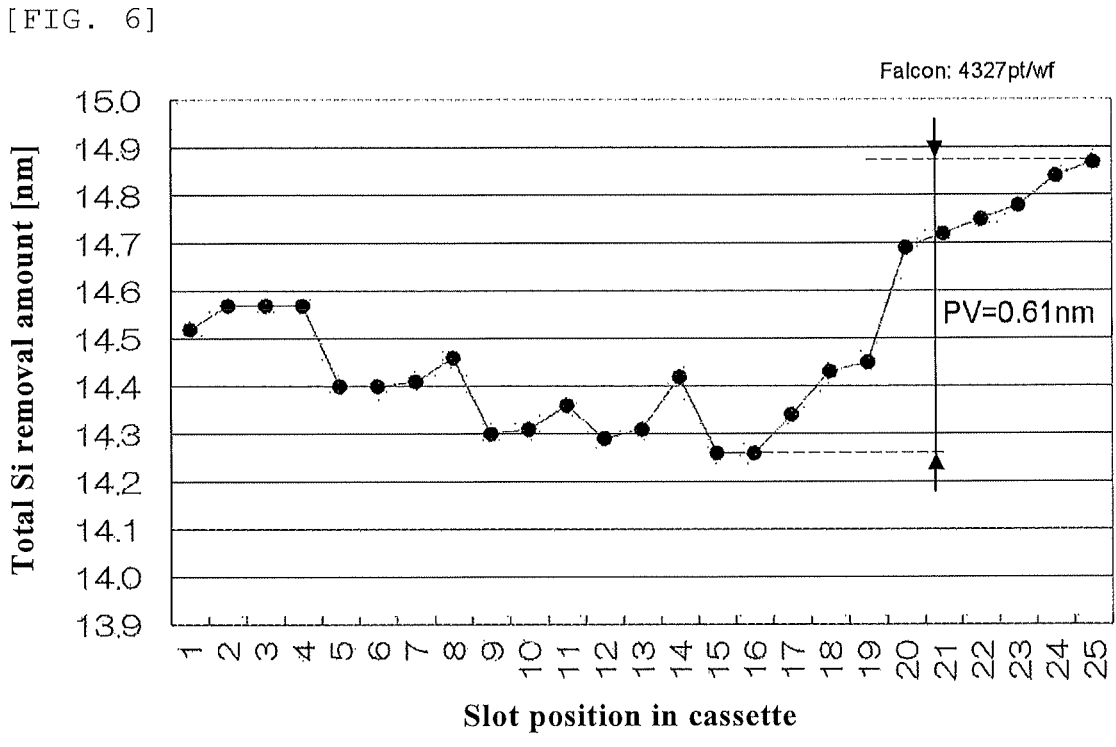
Slot position in cassette
[FIG. 7]
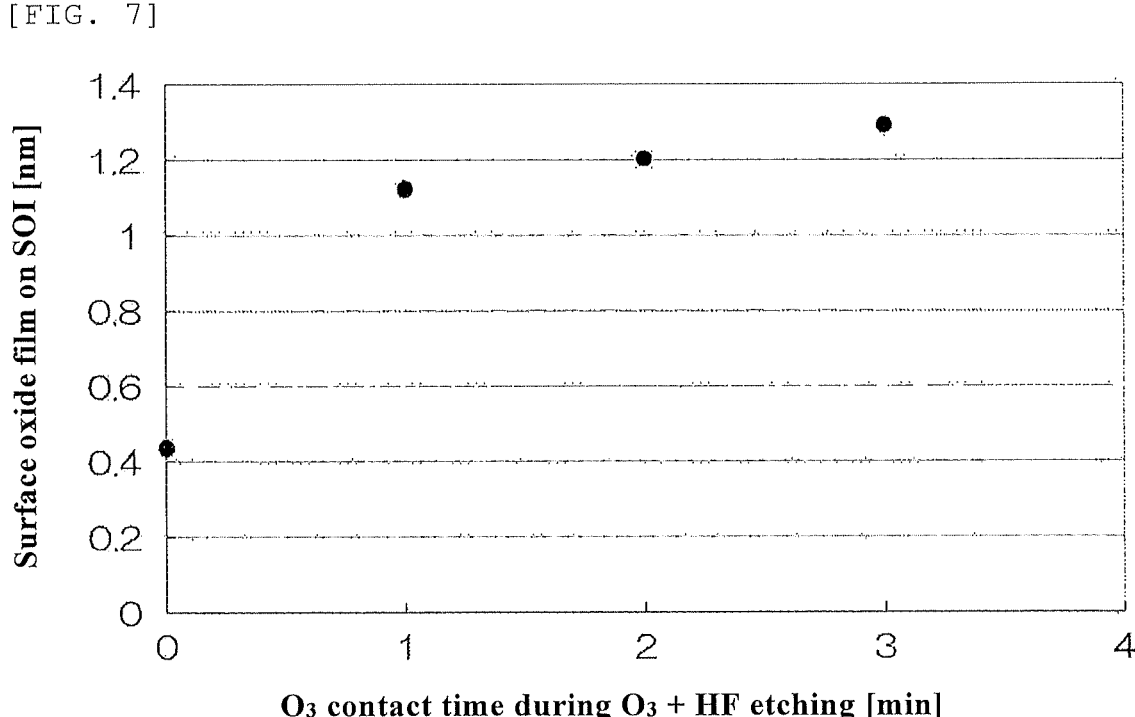
$O_3$ contact time during $O_3$ + HF etching [min]

[FIG. 8]
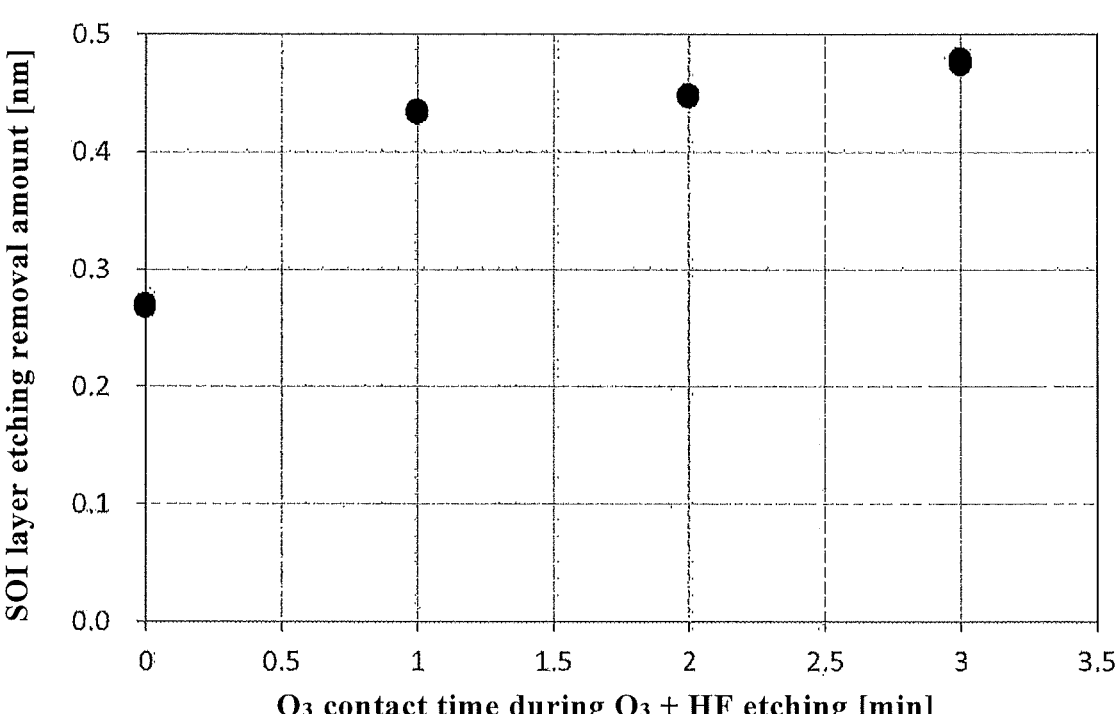

METHOD FOR MANUFACTURING SOI WAFER

TECHNICAL FIELD

The present invention relates to a method for manufacturing an SOI wafer.

BACKGROUND ART

SOI wafers, in particular those called FDSOI (fully depleted silicon-on-insulator) wafers, are required to have extremely high uniformity of film thickness of an SOI layer (SOI film thickness).

Conventionally, as one method for thinning an SOI wafer, the method has been performed in which SOI wafer is subjected to heat treatment in a batch heat treatment furnace to change Si on the surface of the SOI layer into an oxide film by oxidation and then the oxide film is removed. In order to precisely reduce the SOI film thickness to an intended value in this method, it is required to accurately control the thickness of the oxide film to a target value. However, it is very difficult to accurately control the thickness of an actual oxide film, which is grown by heat treatment, because the oxidation rate varies with fluctuations in atmospheric pressure during oxidation. Thus, the following method has been employed when performing film thinning by oxidation: film thinning by oxidation is performed such that the SOI film thickness after the film thinning is slightly (about 3 nm) thicker than an intended value, and then, separately, an etching period is controlled so that the intended value is achieved by film thinning by etching. As disclosed in Patent Document 1, this two-step film thinning method has been performed such that the oxide film after the oxidation is removed and then the SOI film thickness is measured to set a removal amount in the subsequent etching step based on the measured value.

There is also proposed a method to shorten the steps in the above two-step film thinning process including oxidation and etching; the method measures the SOI film thickness with the oxide film remaining after the oxidation and, based on the measured value of the SOI film thickness, performs oxide film removal, etching, and cleaning steps in the same batch cleaning process. Patent Document 2 proposes etching with an SC1 solution as an etchant for use in this method.

Patent Document 3 proposes a method to improve uniformity of the SOI film thickness in the following manner; during etching of an SOI wafer after oxidation, the method adjusts the film thickness to be slightly thicker than a target film thickness by batch cleaning, and then in order to adjust variations in the SOI film thickness within the batch, the method further performs final adjustment of the film thickness to the target value by means of single wafer SC1 etching or the like, based on an etching removal amount for each wafer. FIG. 5 shows a simplified flowchart of a conventional method corresponding to the method disclosed in Patent Document 3. This method can improve the uniformity of the SOI film thickness by reducing a peak to valley (PV) value of the SOI film thickness variations, which, for example, occur within a batch (twenty five wafers) as shown in FIG. 6. However, although the SOI film thickness adjustment using a single wafer cleaning device can correct the SOI film thickness variations within the batch, it cannot provide a large etching removal amount because in-plane variations will increase depending on the removal amount, which is due to facts such as that the temperature of a chemical liquid is relatively high at a chemical liquid application section and that the centrifugal force created by rotation of a wafer holding section causes the flow velocity of the chemical liquid to be faster around the periphery of the wafer. Thus, for such a method, Patent Document 3 proposes a method of controlling an in-batch average of the SOI film thickness after the batch cleaning to be a value between the target value and the target value+0.5 nm in order to minimize the deterioration of the film thickness uniformity caused by the single wafer cleaning machine.

Meanwhile, Patent Document 4 discloses thinning the SOI film using ozone water and HF during final adjustment of the SOI film thickness. The flowchart shown in FIG. 5 also corresponds to the method disclosed in Patent Document 4. The etching in this method is one in which a surface oxide film formed by ozone water is removed with HF, so that the etching removal amount is controlled by the thickness of the surface oxide film formed by ozone water. However, the growth rate of the surface oxide film formed by ozone water depends on the thickness of the surface oxide film; when the surface oxide film is thin, the oxidation rate is high, and when, for example, the surface oxide film exceeds 1 nm as shown in FIG. 7, the oxidation rate becomes extremely low and almost no growth occurs. As such, the Si etching is saturated at about 0.5 nm (FIG. 8).

Therefore, etching of about 0.5 nm or more by treatment with ozone water and HF, though it provides high in-plane uniformity of the etching removal amount, takes too much time. Thus, the treatment with ozone water and HF needs to be repeated. The film thickness that can be etched by this repetition corresponds to the thickness of the oxide film saturated by ozone water, which means that the etching is performed in units of this thickness (equivalent to 0.5 nm Si thickness). Also, even when etching in an amount at or below the saturation of the thickness of the surface oxide film formed by ozone water (about 0.5 nm or less) is performed for final film thickness adjustment, it is difficult to precisely control the etching removal amount because immersion-time dependent changes in the thickness of the surface oxide film formed by ozone water will be large.

CITATION LIST

Patent Literature

Patent Document 1: JP 2007-266059 A
Patent Document 2: JP 2010-092909 A
Patent Document 3: JP 2016-004890 A
Patent Document 4: JP 2004-349493 A

SUMMARY OF INVENTION

Technical Problem

The present invention has been made to solve the above problems. An object of the present invention is to provide a method for manufacturing an SOI wafer that allows for both controlling the etching removal amount and achieving excellent in-plane uniformity of the SOI film thickness in adjusting the SOI film thickness of the SOI wafer.

Solution to Problem

To achieve the object, the present invention provides a method for manufacturing an SOI wafer comprising a step of performing an adjustment to a film thickness of an SOI layer of the SOI wafer by wet etching, wherein in the step of performing the adjustment to the film thickness of the SOI layer:

a first etching step of etching a surface of the SOI layer using an SC1 solution; and a second etching step of etching the surface of the SOI layer by bringing the SOI layer into contact with ozone water to form an oxide film on the surface of the SOI layer and then bringing the formed oxide film into contact with an HF-containing aqueous solution to remove the oxide film, are performed in combination, and the etchings in the first etching step and the second etching step are performed such that a removal amount of the SOI layer in the first etching step is smaller than a removal amount of the SOI layer in the second etching step.

As described above, the inventive method for manufacturing an SOI wafer performs a first etching step where an SC1 solution is used and a second etching step where an oxide film is formed by using ozone water and the oxide film is removed by using an HF-containing aqueous solution, wherein the first and second etching steps are performed in combination during the step of performing an adjustment to the film thickness of the SOI layer. Additionally, the first and second etching steps are performed such that a removal amount of the SOI layer in the first etching step is smaller than that in the second etching step. This feature allows for precisely controlling any etching removal amount while inhibiting deterioration of the in-plane film thickness uniformity. In other words, the inventive method for manufacturing an SOI wafer allows for both controlling the etching removal amount and achieving excellent in-plane uniformity of the SOI film thickness in adjusting the SOI film thickness of the SOI wafer.

The removal amount of the SOI layer in the first etching step is preferably 0.5 nm or less.

With this feature, more excellent in-plane uniformity of the SOI film thickness can be achieved.

The second etching step can be repeated a plurality of times.

With this feature, the high-precision first etching step can be combined with the second etching step, which performs step-by-step etching in units of 0.5 nm, allowing for selection of a target value after the film thinning from a wider range of values.

The first etching step and the second etching step are preferably performed using a single wafer spin etching machine.

Using a single wafer spin etching machine allows for control according to the film thickness of each wafer, which makes it possible to control the film thickness with greater precision. Additionally, using a single wafer spin etching machine easily allows for repeating the second etching step using the ozone water and the HF-containing aqueous solution any number of times.

The SOI layer to be subjected to the adjustment of the film thickness preferably has a film thickness of 50 nm or less.

The present invention is suitable for thinning the SOI layer having an extremely thin film thickness of 50 nm or less. The present invention can manufacture an SOI wafer with a thinned film closer to a target value.

The film thickness of the SOI layer to be subjected to the film thickness adjustment is, for example, 5 nm or more, though there is no particular lower limit on the film thickness.

It is preferably that the second etching step is performed a plurality of times, and the removal amount of the SOI layer in the first etching step is 1 nm or less.

With this feature, more excellent in-plane uniformity of the SOI film thickness can be achieved.

Advantageous Effects of Invention

As described above, the inventive method for manufacturing an SOI wafer allows for both controlling the etching removal amount and achieving excellent in-plane uniformity of the SOI film thickness in adjusting the SOI film thickness of the SOI wafer. As a result, the inventive method for manufacturing an SOI wafer allows for precisely controlling the SOI film thickness to a target value while achieving excellent in-plane uniformity of the film thickness of the extremely thin SOI film.

BRIEF DESCRIPTION OF DRAWINGS

FIG. 1 is a graph showing time dependence of an etching removal amount of an SOI layer using an SC1 solution;

FIG. 2 is a graph showing dependence of an in-plane removal amount Range on the etching removal amount, for each etchant used in a single wafer spin etching machine;

FIG. 3 is a schematic illustration showing an example single wafer spin etching machine;

FIG. 4 is a flowchart of an example of the inventive method for manufacturing an SOI wafer;

FIG. 5 is a simplified flowchart of a conventional method;

FIG. 6 is a graph showing an example of a variation in film thickness within a batch in batch cleaning;

FIG. 7 is a graph showing relationship between ozone water contact time and thickness of a surface oxide film on the SOI in a conventional method; and FIG. 8 is a graph showing relationship between ozone water contact time and an etching removal amount of the SOI layer in the conventional method.

DESCRIPTION OF EMBODIMENTS

As noted above, there have been demands for development of a method for manufacturing an SOI wafer that allows for both controlling the etching removal amount and achieving excellent in-plane uniformity of the SOI film thickness in adjusting the SOI film thickness of the SOI wafer.

The present inventors have earnestly studied to achieve the above object and consequently found that it is possible to precisely control any etching removal amount while inhibiting deterioration of in-plane film thickness uniformity through the following technique: in a step of performing an adjustment to a film thickness of the SOI layer, a first etching step and a second etching step are performed in combination, where an SC1 solution is used in the first etching step and, in the second etching step, an oxide film is formed by using ozone water and then the oxide film is removed by using an HF-containing aqueous solution, and further the first and second etching steps are performed such that a removal amount of the SOI layer in the first etching step is smaller than that in the second etching step. This finding has led to the completion of the present invention.

Specifically, the present invention is a method for manufacturing an SOI wafer comprising a step of performing an adjustment to a film thickness of an SOI layer of the SOI wafer by wet etching, wherein in the step of performing the adjustment to the film thickness of the SOI layer:

a first etching step of etching a surface of the SOI layer using an SC1 solution; and a second etching step of etching the surface of the SOI layer by bringing the SOI layer into contact with ozone water to form an oxide film on the surface of the SOI layer and then bringing the formed oxide film into contact with an HF-containing aqueous solution to remove the oxide film, are performed in combination, and the etchings in the first etching step and the second etching step are performed such that a removal amount of the SOI layer in the first etching step is smaller than a removal amount of the SOI layer in the second etching step.

Hereinafter, the present invention will be described in detail with reference to the drawings, but the present invention is not limited thereto.

As described above, the inventive method for manufacturing an SOI wafer performs, in the step of performing an adjustment to the film thickness of the SOI layer, a first etching step where an SC1 solution is used and a second etching step (which may be hereinafter referred to as "etching with $O_3$+HF") where an oxide film is formed by using ozone water and then the oxide film is removed by using an HF-containing aqueous solution, wherein the first and second etching steps are performed in combination. Additionally, the etchings in the first etching step and the second etching step are performed such that a removal amount of the SOI layer in the first etching step is smaller than a removal amount of the SOI layer in the second etching step.

FIG. 1 shows etching time dependence of an etching removal amount (in-plane average) when an SOI film is etched with an SC1 solution using a single wafer etching machine (spin etching machine), i.e., time dependence of the etching amount of SOI layer using the SC1 solution.

As shown in FIG. 1, the etching removal amount (in-plane average) using the SC1 solution is proportional to the etching time. Accordingly, in the first etching step, the etching removal amount (in-plane average) can be set to any value by adjusting the etching time.

On the other hand, as shown by the black circles in FIG. 2, an in-plane removal amount Range (in-plane difference between maximum and minimum values of the etching removal amount) tends to deteriorate as the etching removal amount (in-plane average) using the SC1 solution increases.

Thus, the present invention has a feature in that the etching with $O_3$+HF (the second etching step) is employed in combination with the first etching step, in which the SC1 solution is used, to adjust the SOI film thickness.

The example of FIG. 2 (white circle and white triangles) shows relationship between the etching removal amount (in-plane average) and the in-plane removal amount Range when one cycle of the etching with $O_3$+HF is performed (shown by the white circle) and then the first etching step with the SC1 solution is performed (shown by the white triangles).

It can also be seen from FIG. 2 that, with a target etching removal amount set to 1 nm, performing the etching with the SC1 solution alone results in the in-plane removal amount Range of about 0.45 nm, but employing the etching with $O_3$+HF (the second etching step) and the etching with the SC1 solution (the first etching step) in combination can restrict the in-plane removal amount Range to about 0.25 nm.

It can also be seen from FIG. 2 that the in-plane removal amount Range can be restricted by performing the etching such that the target etching removal amount minus the removal amount in the second etching step, i.e., the removal amount of the SOI layer in the first etching step, is smaller than the removal amount of the SOI layer in the second etching step.

Therefore, the inventive method for manufacturing an SOI wafer allows for both controlling the etching removal amount and achieving excellent in-plane uniformity of the SOI film thickness in adjusting the SOI film thickness of the SOI wafer. As a result, the inventive method for manufacturing an SOI wafer allows for precisely controlling the SOI film thickness to a target value while achieving excellent in-plane uniformity of the SOI film thickness.

The removal amount of the SOI layer in the first etching step is preferably 0.5 nm or less.

With this feature, more excellent in-plane uniformity of the SOI film thickness can be achieved.

The removal amount of the SOI layer in the first etching step can be, for example, 0.05 nm or more, though there is no particular lower limit on the removal amount.

Additionally, the second etching step can be performed a plurality of times.

With this feature, the high-precision first etching step can be combined with the second etching step, which performs step-by-step etching in units of 0.5 nm, allowing for selection of a target value after the film thinning from a wider range of values.

For example, in adjusting the film thickness of the SOI wafer, the first etching step with the SC1 solution can be performed with the etching removal amount of 0.5 nm or less, and the remaining thickness can be etched through repetitions of the second etching step with the ozone water and the HF-containing aqueous solution. Also, in the second etching step with the ozone water and the HF-containing aqueous solution, the treatment is performed during a period in which the surface oxide film formed by ozone water is saturated (about 1 min), and repeating the treatment enables the etching in units of 0.5 nm. The combination of the repetitions of the second etching step of 0.5 nm with the ozone water and the HF-containing aqueous solution and the first etching solution of 0.5 nm or less with the SC1 solution makes it possible to both precisely control any etching removal amount and achieve more excellent uniformity of the in-plane film thickness.

Alternatively, it is also preferred that the second etching step is performed a plurality of times and the removal amount of the SOI layer in the first etching step is 1 nm or less.

When the second etching step is performed only once, the removal amount of the SOI layer is about 0.5 nm, so that the removal amount of the SOI layer in the first etching step needs to be 0.5 nm or less. However, when the second etching step is performed a plurality of times, the removal amount of the SOI layer is at least about 1 nm. Accordingly, by setting the removal amount of the SOI layer in the first etching step to 1 nm or less, the removal amount of the SOI layer in the first etching step can be less than half of the total removal amount, which allows for achieving more excellent in-plane uniformity of the SOI film thickness.

The order of the first etching step with the SC1 solution and the second etching step with the ozone water and the HF-containing aqueous solution is not limited to a particular order; performing the second etching step before, after, or both before and after the first etching step with the SC1 solution can provide the same effects.

When the second etching step is performed a plurality of times, the second etching step may be performed a plurality of times after the first etching step, or may be performed a plurality of times before the first etching step. Alternatively, the second etching step may be performed one or more times before the first etching step and one or more times after the first etching step.

In repeating the second etching step, treatment with the ozone water may be added as a final step to hydrophilize the surface.

After the removal of the oxide film with the HF-containing aqueous solution in the second etching step, cleaning with the ozone water or the SC1 solution may be added to remove LPD.

Performing the first etching step (etching with the SC1 solution) and the second etching step (etching with the ozone water and the HF-containing aqueous solution) in a single wafer spin etching machine allows for control according to the film thickness of each wafer, which makes it possible to control the film thickness with greater precision. Also, the etching with $O_3$+HF can be easily repeated any number of times.

An example single wafer spin etching machine that can be used in the inventive method for manufacturing an SOI wafer is now described.

FIG. 3 is a schematic illustration showing an example single wafer spin etching machine. The single wafer spin etching machine 10 shown in FIG. 3 includes a wafer holding and rotating mechanism 1 and a supply nozzle 2. The wafer holding and rotating mechanism 1 is configured to hold and rotate an SOI wafer 20 including an SOI layer to be subjected to the film thickness adjustment. The supply nozzle 2 is configured to supply a chemical liquid 3 for use in each etching step onto the wafer 20.

Should be noted that the etching machine that can be used in the inventive method for manufacturing an SOI wafer is not limited to a particular machine, and any machine that is configured to adjust the SOI film thickness of the SOI wafer can be used. Thus, for example, a single wafer cleaning machine can be used as the single wafer etching machine.

The method for thinning an SOI wafer described above can be applied to any SOI wafer preparation method, including an ion implantation separation method, a SIMOX method, and an rT-CCP method.

As the SC1 solution used in the first etching step, use can be made of a mixed aqueous solution of $NH_4OH$ and $H_2O_2$, which is commonly used as an SC1 solution for cleaning of silicon wafers in semiconductor manufacturing.

As the ozone water for the second etching step, use can be made of ozone water having an ozone ($O_3$) concentration of 1 to 50 ppm.

The HF-containing aqueous solution used in the second etching step can have an HF concentration in the range of 0.1 wt % to 50 wt %.

A specific example of the inventive method for manufacturing an SOI wafer is now described with reference to FIG. 4.

First, an SOI wafer to be subjected to the treatment is provided (S1). As mentioned earlier, there are no particular limitations on methods for manufacturing the SOI wafer in the present invention.

Then, the provided SOI wafer is subjected to thin oxide film formation (S2). In this example, the oxide film is formed under conditions such that the SOI film thickness is about 3 nm thicker than a target value (Target).

Then, oxide film removal cleaning is performed to remove the oxide film formed on the surface of the SOI layer (S3). In this example, in a batch treatment process, the oxide film is removed using an HF-containing aqueous solution, followed by RCA cleaning.

Then, the SOI film thickness with the oxide film removed is measured (S4). For example, an ellipsometer can be used for the measurement.

Then, the step of adjusting the film thickness of the SOI layer of the SOI wafer is performed by wet etching (S5). In this example, the film thickness of the SOI layer is adjusted by single wafer spin etching.

FIG. 4 shows two examples in the step of adjusting the SOI film thickness, namely an example where the first etching step using the SC1 solution is performed and then the second etching step with $O_3$+HF is performed a plurality of times, and an example where the second etching step with $O_3$+HF is performed a plurality of times and then the first etching step using the SC1 solution is performed, eventually followed by the second etching step with $O_3$+HF. In either example, the total removal amount in the first etching step is made smaller than the total removal amount in the second etching step.

EXAMPLE

The present invention is described below in detail using Example and Comparative Examples, although the present invention is not limited thereto.

Example 1

[Providing of SOI Wafers]

Twenty-five SOI wafers with a diameter of 300 mm and an SOI film thickness of 150 nm fabricated by an ion implantation separation method were provided.

[Oxidation Step]

The provided twenty-five wafers were subjected to an oxidation step under the conditions shown in Table 1 below.

[Oxide Film/SOI Film Thickness Measurement]

Each wafer subjected to the oxidation step was subjected to oxide film/SOI film thickness measurement. The results are shown in Table 1 below.

[Batch Cleaning]

Each wafer having the SOI film thickness measured after the oxidation step was subjected to oxidation film removal cleaning with an HF-containing aqueous solution in a batch cleaning machine. The conditions are shown in Table 2 below. Then, each wafer was subjected to SOI film thickness measurement. The results are shown in Table 2 below.

[Film Thickness Adjustment Etching in Single Wafer Process (Step of Adjusting the Film Thickness of the SOI Layer)]

Subsequently, using a single wafer etching machine (spin etching machine), each wafer was subjected to the etching with the SC1 solution (the first etching step) and then to the etching with $O_3$+HF (bringing the wafer into contact with the ozone water, followed by etching it with the HF-containing aqueous solution (the second etching step)). The etching with the SC1 solution was performed so as to adjust the film thickness with the removal amount of 0.5 nm or less, as shown in Table 2 below. The etching with $O_3$+HF was performed repeatedly, as shown in Table 2 below. The number of repetitions was varied depending on the film thickness value of each wafer. In the repetitions of the etching with $O_3$+HF, treatment with the ozone water was added as a final step to hydrophilize the surface. The SOI wafers were thus manufactured.

After the second etching step, the SOI film thickness of each SOI wafer was measured. The results are shown in Table 2 below.

Comparative Example 1

In Comparative Example 1, SOI wafers were manufactured in the same manner as in Example 1, except that SC1 etching was performed under the conditions shown in Table 2 below after the oxide film removal cleaning in batch cleaning and that the second etching step was not performed during the film thickness adjustment etching in the single wafer process. That is, in Comparative Example 1, the film thickness adjustment etching was performed only by the SC1 cleaning (etching with the SC1 solution).

Comparative Example 2

In Comparative Example 2, SOI wafers were manufactured in the same manner as in Example 1, except that the film thickness adjustment etching was performed only by the etching with $O_3$+HF (the second etching step). The conditions of the second etching step performed in Comparative Example 2 are shown in Table 2 below.

The results of each SOI film thickness measurement in Comparative Examples 1 and 2 are shown in Table 2 below, along with the results of Example 1.

TABLE 1

|  | Comparative Examples 1 and 2 and Example (in common) |
|---|---|
| SOI film thickness of provided SOI wafers (before film thinning) (Target value after film thinning: 12 nm) | SOI film thickness = 150 nm Number of wafers provided: 25 wafers each |
| Oxidation step | (Oxidation conditions) 950° C., 2 hrs, under pyrogenic atmosphere |
| Measurement of Oxide film/SOI film thickness (Ellipsometer) | Oxide film thickness = 300 nm In-batch average of SOI film thickness = 15.8,nm (which represents, based on an SOI film thickness average calculated for each wafer (measured at 41 points in the plane), an average of the averages of 25 wafers.) In-batch average Range = 1.2 nm (which represents, based on an SOI film thickness average calculated for each wafer, a Range (maximum value − minimum value) of the averages within the batch (25 wafers).) In-plane Range = 0.5 nm (which represents, based on an in-plane Range (maximum value − minimum value) calculated for each wafer, an average of the Ranges of 25 wafers.) |

TABLE 2

|  | Comparative Example 1 | Comparative Example 2 | Example 1 |
|---|---|---|---|
| Batch cleaning |  |  |  |
| Oxide film removal cleaning (HF) | HF 15%, 100 sec | HF 15%, 100 sec | HF 15%, 100 sec |
| SC1 etching | SC1 120 sec (Average removal amount 3.4 nm) | Not performed | Not performed |

TABLE 2-continued

|  | Comparative Example 1 | Comparative Example 2 | Example 1 |
|---|---|---|---|
| SOI film thickness measurement (Ellipsometer) | In-Batch average of SOI film thickness = 12.4 nm | In-Batch average of SOI film thickness = 15.8 nm | In-Batch average of SOI film thickness = 15.8 nm |
| [Single wafer film thickness adjustment etching] |  |  |  |
| (1) SC1 etching (First etching step) | SC1 20-60 sec (Removal amount: 0.3-0.5 nm) | Not performed | SC1 20-60 sec (Removal amount: 0.3-0.5 nm) |
| (2) $O_3$ + HF etching (Second etching step) | Not performed | $O_3$(1 min) + HF (repeated 7-9 times) (Removal amount: 3.5-4.5 nm) | $O_3$(1 min) + HF (repeated 6-8 times) (Removal amount: 3.0-4.0 nm) |
| $O_3$ surface finish SOI film thickness measurement (Ellipsometer) | Not performed In-Batch average of SOI film thickness = 12.0 nm Batch average Range = 0.2 nm In-plane Range = 0.9 nm | Performed In-Batch average of SOI film thickness = 11.8 nm Batch average Range = 0.9 nm In-plane Range = 0.5 nm | Performed In-Batch average of SOI film thickness = 12.0 nm Batch average Range = 0.2 nm In-plane Range = 0.6 nm |

SC1 conditions: $NH_4OH$ (29 wt %):$H_2O_2$ (30 wt %):$H_2O$=1:1:5, liquid temperature of 76°.

Ozone water: $O_3$ (12 ppm).

HF (HF-containing aqueous solution) in the second etching step: HF (15 wt %).

In the case of Comparative Example 1, where the film thickness was adjusted only with the SC1 solution, the in-batch average of SOI film thickness and the in-batch average Range within the same cassette were as good as 12.0 nm and 0.2 nm, respectively, but the average of the in-plane Ranges of the respective wafers was detrimentally increased to 0.9 nm due to deterioration of the in-plane film thickness distribution of each wafer, which was caused by the SC1 cleaning.

In the case of Comparative Example 2, where the film thickness was adjusted only with the ozone water and HF, the in-plane Range was as good as 0.5 nm, but the in-batch average of SOI film thickness within the same cassette was 11.8 nm, which was off from the target. Additionally, the batch average Range was 0.9 nm, showing no substantial improvement.

In Example, on the other hand, as is apparent from the results shown in Table 2, the in-batch average of SOI film thickness within the same cassette was precisely adjusted to the target (target value) of 12.0 nm, and the average Range within the cassette also greatly improved to 0.2 nm. Also, the in-plane Range was 0.6 nm, which was better than Comparative Example 1.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A method for manufacturing an SOI wafer comprising a step of performing an adjustment to a film thickness of an SOI layer of the SOI wafer by wet etching, wherein in the step of performing the adjustment to the film thickness of the SOI layer, both of a first etching step and a second etching step are performed, the first etching step is an etching step of etching a surface of the SOI layer using an SC1 solution; and the second etching step is an etching step of etching the surface of the SOI layer by bringing the SOI layer into contact with ozone water to form an oxide film on the surface of the SOI layer and then bringing the formed oxide film into contact with an HF-containing aqueous solution to remove the oxide film, and the etchings in the first etching step and the second etching step are performed such that a removal amount of the SOI layer in the first etching step is smaller than a removal amount of the SOI layer in the second etching step.

2. The method for manufacturing an SOI wafer according to claim 1, wherein the removal amount of the SOI layer in the first etching step is 0.5 nm or less.

3. The method for manufacturing an SOI wafer according to claim 2, wherein the second etching step is repeated a plurality of times.

4. The method for manufacturing an SOI wafer according to claim 3, wherein the first etching step and the second etching step are performed using a single wafer spin etching machine.

5. The method for manufacturing an SOI wafer according to claim 4, wherein the SOI layer to be subjected to the adjustment of the film thickness has a film thickness of 50 nm or less.

6. The method for manufacturing an SOI wafer according to claim 3, wherein the SOI layer to be subjected to the adjustment of the film thickness has a film thickness of 50 nm or less.

7. The method for manufacturing an SOI wafer according to claim 2, wherein the first etching step and the second etching step are performed using a single wafer spin etching machine.

8. The method for manufacturing an SOI wafer according to claim 7, wherein the SOI layer to be subjected to the adjustment of the film thickness has a film thickness of 50 nm or less.

9. The method for manufacturing an SOI wafer according to claim 2, wherein the SOI layer to be subjected to the adjustment of the film thickness has a film thickness of 50 nm or less.

10. The method for manufacturing an SOI wafer according to claim 1, wherein the second etching step is repeated a plurality of times.

11. The method for manufacturing an SOI wafer according to claim 10, wherein the first etching step and the second etching step are performed using a single wafer spin etching machine.

12. The method for manufacturing an SOI wafer according to claim 11, wherein the SOI layer to be subjected to the adjustment of the film thickness has a film thickness of 50 nm or less.

13. The method for manufacturing an SOI wafer according to claim 10, wherein the SOI layer to be subjected to the adjustment of the film thickness has a film thickness of 50 nm or less.

14. The method for manufacturing an SOI wafer according to claim 1, wherein the first etching step and the second etching step are performed using a single wafer spin etching machine.

15. The method for manufacturing an SOI wafer according to claim 14, wherein the SOI layer to be subjected to the adjustment of the film thickness has a film thickness of 50 nm or less.

16. The method for manufacturing an SOI wafer according to claim 1, wherein the SOI layer to be subjected to the adjustment of the film thickness has a film thickness of 50 nm or less.

17. The method for manufacturing an SOI wafer according to claim 1, wherein the second etching step is performed a plurality of times, and the removal amount of the SOI layer in the first etching step is 1 nm or less.

* * * * *